United States Patent [19]

Shin

[11] Patent Number: 5,270,257

[45] Date of Patent: Dec. 14, 1993

[54] METHOD OF MAKING METAL OXIDE SEMICONDUCTOR FIELD EFFECT TRANSISTORS WITH A LIGHTLY DOPED DRAIN STRUCTURE HAVING A RECESS TYPE GATE

[75] Inventor: Hyung S. Shin, Seoul, Rep. of Korea

[73] Assignee: Gold Star Electron Co., Ltd., Chungcheongbuk, Rep. of Korea

[21] Appl. No.: 883,857

[22] Filed: May 15, 1992

[30] Foreign Application Priority Data

May 15, 1991 [KR] Rep. of Korea ............... 7881/1991

[51] Int. Cl.$^5$ ................. H01L 21/44; H01L 21/48
[52] U.S. Cl. ........................... 437/203; 437/29; 437/41; 437/44; 437/154; 257/244
[58] Field of Search ............... 437/203, 41, 42, 38, 437/44; 257/300, 301, 303, 328, 329, 330, 332, 336

[56] References Cited

U.S. PATENT DOCUMENTS 4,939,100 7/1990 Jeuch et al. .................. 437/44
5,012,306 4/1991 Tasch, Jr. et al. ............. 257/336

Primary Examiner—Olik Chaudhuri
Assistant Examiner—H. Jey Tsai

Attorney, Agent, or Firm—Faegre & Benson

[57] ABSTRACT

A method of making a metal oxide semiconductor field effect transistor. An oxide layer is grown on the overall exposed surface of a substrate, which then has a trench formed by an etching process. A polysilicon layer is deposited on the trenched substrate, by using a nitride layer formed on the substrate as a mask, to form a gate region of a predetermined thickness. Then, the nitride layer is removed. The exposed portion of the polysilicon gate layer is then oxidized. Then, the exposed portion of the silicon substrate, disposed at opposite sides of the gate electrode, is subjected to a low concentration n-type ion injection, to form low concentration drain and source regions. Then, an oxide side wall is formed to surround the gate electrode. The exposed surface of the silicon substrate, disposed at opposite sides of the gate electrode, is subjected to a high concentration n-type ion injection. Then, an epitaxial layer is grown using the high concentration n-type ions as seeds, to form high concentration drain and source regions. In accordance with the method, it is possible to reduce the capacitance at junctions between gate and drain regions and between drain and source regions and the overall size of the produced semiconductor chip.

7 Claims, 5 Drawing Sheets

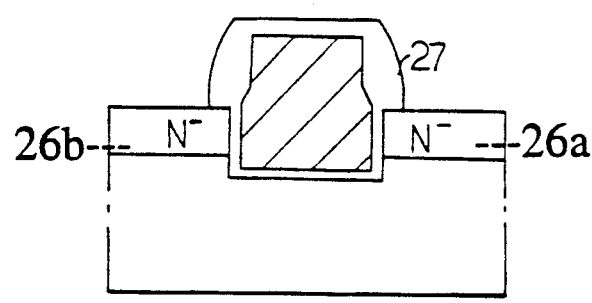
F I G. 3d
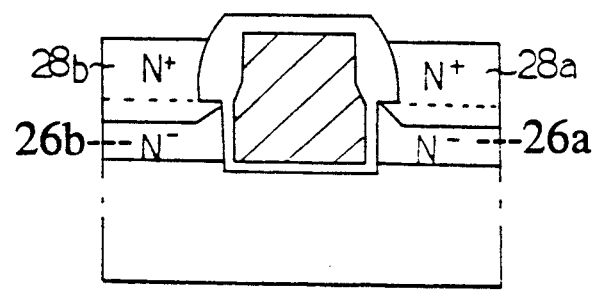
F I G. 3e

METHOD OF MAKING METAL OXIDE SEMICONDUCTOR FIELD EFFECT TRANSISTORS WITH A LIGHTLY DOPED DRAIN STRUCTURE HAVING A RECESS TYPE GATE

BACKGROUND OF THE INVENTION

1. Field of the Invention

The present invention relates to a method of making metal oxide semiconductor field effect transistors (MOSFETs), and more particularly to a method of making metal oxide semiconductors field effect transistors with a lightly doped drain (LDD) structure having a recess type gate.

2. Description of the Prior Art

Referring to FIGS. 1a and 1b, there is shown a general construction of a prior art metal oxide semiconductor field effect transistor (MOSFET).

As shown in FIG. 1a, the MOSFET comprises a substrate 1 of a predetermined conduction type, a gate oxide layer 2 coated on the substrate 1 and a gate 3 coated on the oxide layer 2. The MOSFET also comprises a drain region 4 and a source region 5 formed on the substrate below opposite edge portions of the gate 2, respectively.

The operation of the MOSFET with the abovementioned construction will now be described in conjunction with FIGS. 1a and 1b.

As a drive voltage is applied to the gate 3, a charging occurs between holes of the gate 3 and electrons of the silicon substrate 1, across the gate oxide layer 2, thereby forming a channel having a predetermined thickness between the drain region 4 and the source region 5. Electrons flow from the source region 5 to the drain region 4. At this time, a peak electric field is formed at the edge portion of the gate 3, where the gate 3 and the drain region 4 are in contact with each other.

That is, the carrier concentration, shown as a solid line in FIG. 1b, is sharply decreased in the area where the gate 3 and the drain region 4 are in contact with each other, while it recovers in the drain region 4 which is of a high concentration n-type, as shown in FIG. 1b. As a result, the gate oxide layer 2, which functions to isolate electrically the gate 3 and the drain region 4, may be damaged by hot electrons generated at the edge portion of the gate 3. The hot electrons are then trapped in the gate 3, via the gate oxide layer 2. The trapped electrons are re-combined with holes of the gate 3. This phenomenon is referred to as a "Hot Carrier Effect". Due to the hot carrier effect, the transistor actually requires a gate bias voltage higher than a predetermined voltage for driving it.

Various techniques for reducing the hot carrier effect have been proposed. Referring to FIGS. 1c and 1d, there is illustrated an example of these techniques.

As shown in FIG. 1c, the exemplified MOSFET construction comprises a low doping concentration n-type drain region 6 formed between the gate 3 and the high doping concentration n-type drain region 4 and adapted to degrade current at the edge portion of the gate 3.

As the carrier concentration decreases, the depletion region in the channel increases, thereby causing the total channel length d to be lengthened. The above construction utilizes the effect of a lengthened total channel length.

Accordingly, the intensity E of the electric field in this case is decreased to reduce the hot carrier effect, according to the following formula:

$$E = V / d \quad (1)$$

In this case, however, the length of the low concentration n-type drain region 6 should be sufficiently long. This is because the intensity E of the electric field becomes low only when the drain bias effects on the area are as large as possible, via the high concentration n-type drain region 4.

Therefore, as the intensity E of the electric field decreases, the depletion region in the channel extends from the low concentration n-type drain region 6 to a low concentration source region 7, so as to be enlarged, thereby reducing the hot carrier effect.

Also, the low concentration n-type drain region 6 should be overlapped with the gate 3. If the gate does not overlap the drain region 6, as shown in FIGS. 1c and 1d, the carrier concentration decreases abruptly at the portion D of the low concentration n-type drain region 6 which is withdrawn from the voltage control of the gate 3. As a result, the intensity of the electric field increases at the portion D of the low concentration n-type drain region 6. That is, the doping concentration of the transistor increases gradually in the order of the p-type substrate 1, the low concentration n-type drain 6, and the high concentration n-type drain 4, as shown by the dotted line in FIG. 1d. As a predetermined voltage is applied to the gate 3, the carrier concentration is maintained at a predetermined level at the p-type substrate and increases gradually at the low concentration n-type drain 6, as shown by the solid line in FIG. 1d. At the position where the voltage control of the gate 3 ends, the carrier concentration decreases abruptly and then recovers at the high concentration n-type drain 4. As a result, the intensity of the electric field is increased at the region where the carrier concentration decreases, thereby causing the hot carrier effect.

FIGS. 2a to 2c illustrate a method of making a MOSFET comprising a gate completely overlapping the low concentration n-type drain and source region. This method is disclosed in a paper, "A New LDD Structure: Total Overlap with Polysilicon Spacer (TOPS)" published in IEEE Electron Device Letters Vol. 11 No. 5., pages 221–222, published in May, 1990.

As shown in FIG. 2a, a thin initial oxide layer 12 is grown on a silicon substrate 11. On the initial oxide layer 12, a first thin polysilicon layer 13 and thin oxide layer 14 and formed, in turn. On the oxide layer 14, a second polysilicon layer 15 is formed, which has the thickness thicker than that of the first polysilicon layer 13.

Thereafter, the second polysilicon layer 15 is subjected to a photo lithography process to define a gate therein, as shown in FIG. 2b. The second polysilicon layer 15 is then etched back to remove the unnecessary portion therefrom. Subsequently, low concentration n-type ions are injected into the substrate 11, via the first polysilicon layer 13 and the initial oxide layer 12, to form a low concentration n-type drain 16 and a low concentration n-type source 19. The second oxide layer 14 is then subjected to a wet etch utilizing a neutralized dilute HF solution.

Thereafter, a third polysilicon layer 15a is coated on the overall exposed surface, as shown in FIG. 2c. The second and the third polysilicon layer 15 and 15A, and the initial oxide layer 12 are then etched back, in the same manner as the first layer 13, thereby forming the gate surrounded by a side wall.

Subsequently, high concentration n-type ions are injected into the substrate 11, forming a high concentration n-type source 20 and a high concentration n-type drain 18.

The portion of silicon substrate 11 between the low concentration n-type drain 16 and the low concentration n-type source 19 is subjected to an ion injection, to provide a stop to a punchthrough effect.

In the above-mentioned construction, however, the channel formed between the low concentration n-type drain 16 and the low concentration n-type source 19 has the length of submicron or deep-submicron dimension, so that the reduction of the hot carrier effect is limited. In the construction, there is also a disadvantage of the increase in the junction capacitance between the gate and the source and between the gate and the drain. Also, the doping compensation effect caused by the injection of low concentration n-type ions can not be reduced due to the injection of ions into the channel.

SUMMARY OF THE INVENTION

Therefore, an object of the invention is to provide a method of making a metal oxide semiconductor field effect transistor, wherein low concentration n-type regions are overlapped with a recess type gate, thereby enabling reduction of the capacitance of the produced transistor, reduction of the entire size of the produced semiconductor chip and decrease in the doping compensation effect.

In accordance with the present invention, this object can be accomplished by providing a method of making a metal oxide semiconductor field effect transistor comprising steps of:

a) forming a first insulation layer on a substrate of a first conductivity type, etching a predetermined portion of the first insulation layer, and then etching the first conductivity-type substrate to a predetermined thickness, to form a trench on the substrate;

b) growing a second insulation layer on the overall exposed surface of the first insulation layer and the trenched substrate and then forming a gate electrode on the trench having the grown second insulation layer;

c) removing the remaining first insulation layer, forming a third insulation layer on the exposed surface of the substrate and the gate electrode, and then low concentration drain and source regions of a second conductivity type;

d) forming a side wall surrounding the gate electrode; and e) forming high concentration drain and source regions of a second conductivity type on the low concentration drain and source regions, which correspond to opposite sides of the gate electrode, respectively.

BRIEF DESCRIPTION OF THE DRAWINGS

Other objects and aspects of the invention will become apparent from the following description of embodiments with reference to the accompanying drawings in which:

FIG. 1b is a potential profile graph of the construction of FIG. 1a;

FIGS. 3a to 3e are schematic sectional views illustrating a method of making an LDD MOSFET in accordance with the present invention.

DETAILED DESCRIPTION OF THE PREFERRED EMBODIMENTS

Referring to FIGS. 3a to 3e, there is illustrated a preferred embodiment of a method of making MOSFETs in accordance with the present invention. In the method, a nitride layer 22 is first deposited on a silicon substrate 21. The material of the nitride layer 22 may be, for example, $Si_3N_4$. The nitride layer 22 is then subjected to a photo lithography process, to etch the portion thereof positioned as the region where a gate is to be formed. Thereafter, p-type ions adapted to avoid a short channel effect are injected into the substrate 21 and the nitride layer 22 is used as a mask. The silicon substrate 21 is then etched to a predetermined depth, to form a trench. The nitride layer 22 may alternatively be an oxide layer having the etch selectively higher than that of the silicon substrate 21.

Figure 1A:
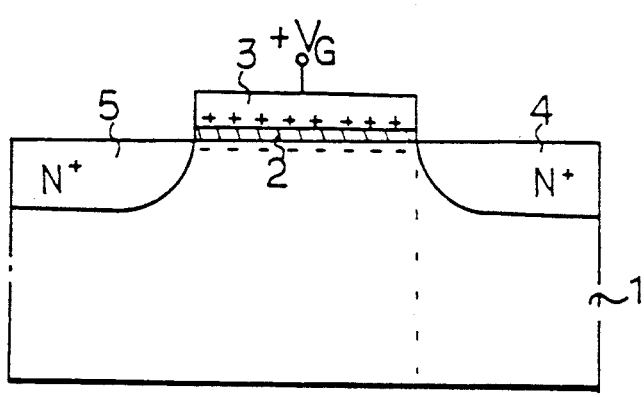
FIG. 1a is a schematic sectional view illustrating the construction of a general MOSFET.
Figure 1B:
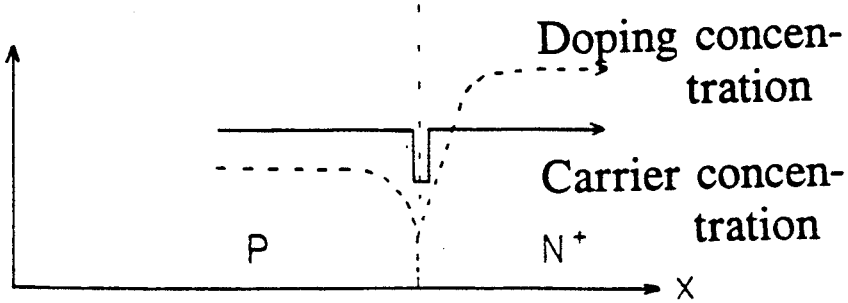
Figure 1C:
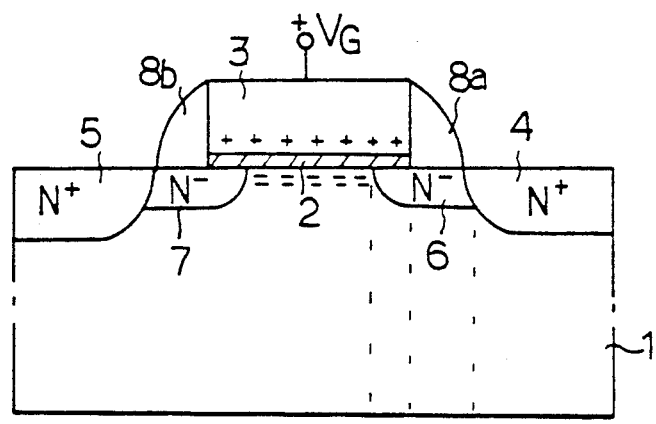
FIG 1c is a schematic sectional view illustrating the construction of a conventional LDD MOSFET comprising a gate and a low concentration n-type layer partially overlapped with the gate.
Figure 1D:
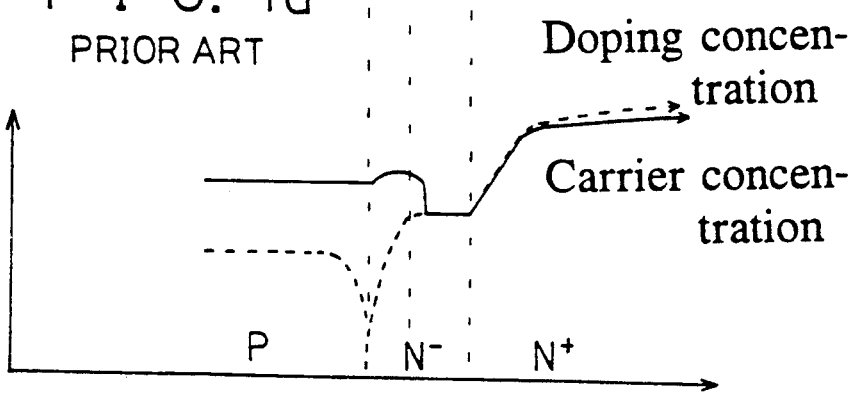
FIG. 1d is a potential profile graph of the construction of FIG. 1c.
Figure 2A:
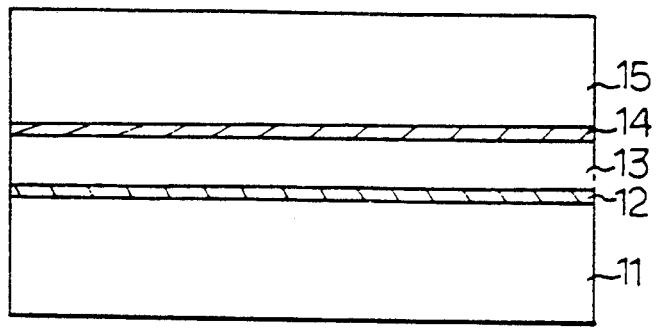
FIGS. 2a to 2c are schematic sectional views illustrating a method of making a conventional LDD MOSFET having comprising a gate overlapping completely a low concentration n-type layer.
Figure 2B:
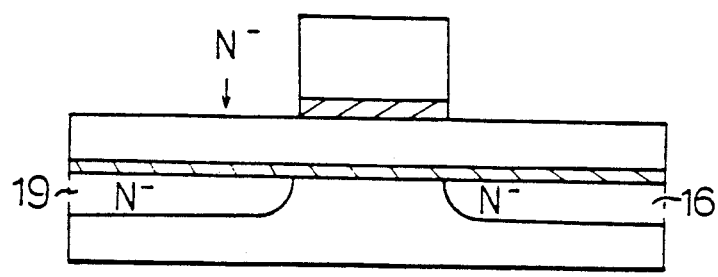
Figure 2C:
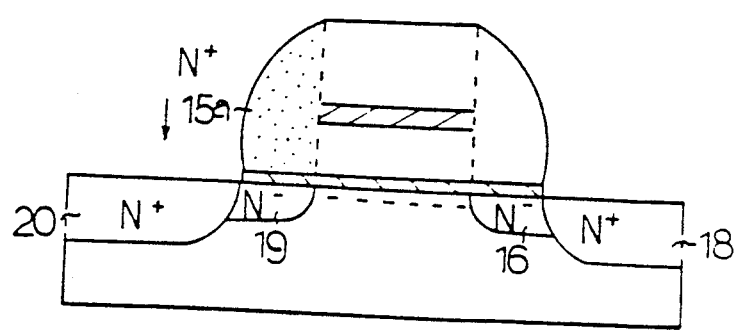
Figure 3A:
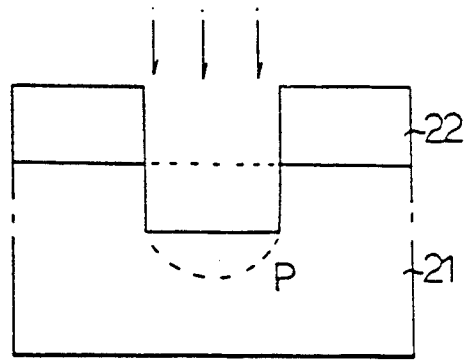
Figure 3B:
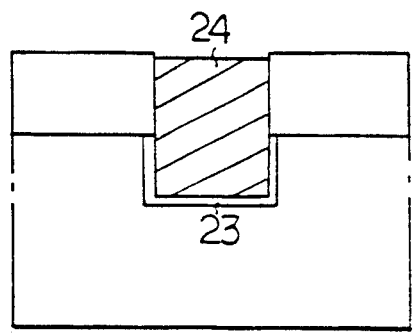

Thereafter, a gate oxide layer 23 is grown on the overall exposed trench surface of the silicon substrate 21 and the nitride layer 22, as shown in FIG. 3b. At this time, an oxidizing reaction is not generated at the nitride layer 22, so that no gate oxide layer is grown on the nitride layer 22. On the gate oxide layer 23, a polysilicon layer 24 is thickly deposited to fill the trench of silicon substrate 21. The polysilicon layer 24 is then etched back to the depth that the nitride layer 22 is exposed.

Figure 3C:
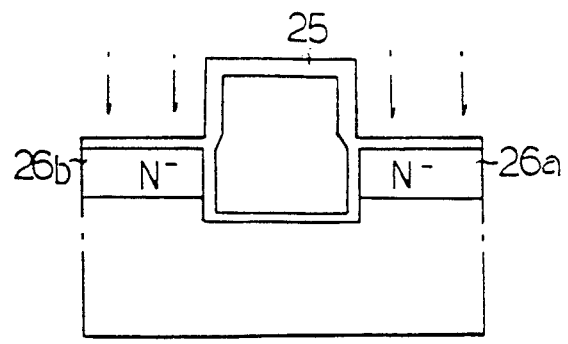

Subsequently, the nitride layer is removed and the exposed portion of the polysilicon gate 24 is oxidized to form an oxide layer 25 having a predetermined thickness, to make the remaining gate oxide layer 23 good quality, as shown in FIG. 3c. Then, a low concentration n-type dopant is ion-injected into the silicon substrate 21 to form a low concentration n-type source 26a and a low concentration n-type drain 26b.

The low concentration n-type source and drain 26a and 26b may be formed by ion-injecting a low concentration n-type dopant into the silicon substrate 21, prior to depositing the nitride layer 22 on the silicon substrate 21, and then removing the unnecessary part of the ion-injected portion of the silicon substrate 21, upon forming the trench on the silicon substrate 21.

Then an oxide layer is grown on the overall exposed surface of the low concentration n-type source and drain 26a and 26b and the gate polysilicon layer 24. The oxide layer is then subjected to an anisotropic etch. According to the anisotropic etching of the oxide layer, an oxide side wall 27 is formed which surrounds the polysilicon gate layer 24, as shown in FIG. 3d, because the gate polysilicon 24 has a high oxidation rate.

On the low concentration n-type source and drain 26a and 26b, a high concentration n-type epitaxial layer is grown to form a high concentration n-type source and drain 28a and 28b. Alternatively, these high concentration n-type epitaxial drain and source 28a and 28b may be formed by doping the high concentration n-type dopant in situ upon the epitaxial growth, or by ion-injecting the high concentration n-type dopant upon the epitaxial growth.

In accordance with the method of the present invention, the following effects are obtained:

First, the capacitance of the transistor can be reduced, because all low concentration n-type regions can be completely overlapped with the recessed gate, that is, since only the low concentration n-type source and drain 26a and 26b is coated with the thin gate oxide layer 23, while the high concentration n-type ion doped regions are surrounded by the thick oxide side wall 27, to be isolated from the gate;

Second, the entire size of the produced semiconductor chip can be reduced, because the gate region is formed below the low concentration n-type source and drain and the side wall surrounding the gate is an oxide layer, thereby decreasing the horizontal layout determining the size of the semiconductor chip; and Third, the doping compensation effect can be decreased, because the p-type ion doped channel of the trenched silicon substrate is isolated from the low concentration n-type ion doped region.

Although preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of making a metal oxide semiconductor field effect transistor comprising steps of:
    a) forming a first insulation layer on a substrate of a first conductivity type, etching a portion of the first insulation layer, and then etching the first conductivity type substrate to a thickness, to form a trench on the substrate;
    b) growing a second insulation layer on the overall exposed surface of the first insulation layer and the trenched substrate and then forming a gate electrode in the trench having the grown second insulation layer, so that the gate electrode is etched back to a depth that the first insulation layer is exposed;
    c) removing a remaining first insulation layer, forming a third insulation layer on an exposed surface of the substrate and the gate electrode, and then forming low concentration drain and source regions of a second conductivity type;
    d) forming a side wall surrounding the gate electrode; and
    e) forming high concentration drain and source regions of a second conductivity type on the low concentration drain and source regions, which correspond to opposite sides of the gate electrode, respectively.

2. A method in accordance with claim 1, wherein the step (a) further comprises a step of doping a dopant having the same type as that of the substrate, on the portion of the substrate corresponding to the trench, by using the remaining first insulation layer as a mask, after the formation of the trench on the substrate.

3. A method in accordance with claim 1, wherein the step of forming the gate electrode on the trench in the step (b) further comprises steps of forming a polysilicon layer on the trenched substrate to fill the trench and then etching back the polysilicon layer.

4. A method in accordance with claim 1, wherein the step (d) further comprises steps of growing an oxide layer on the exposed surface of the low concentration drain and source regions and the gate electrode, and then anisotropically etching the oxide layer.

5. A method in accordance with claim 1, wherein the step (e) further comprises doping a second conductivity type dopant on respective low concentration drain and source regions, corresponding to opposite sides of the gate electrode and then epitaxially growing the second ion doped regions.

6. A method in accordance with claim 1, wherein the step of forming the low concentration drain and source regions in the step (c) further comprises doping low concentration dopant of the second conductive type into the substrate, prior to forming the first insulation layer on the substrate, and removing the portion of the formed low concentration regions where a gate electrode is to be formed in said low concentration drain and source region upon performing the step of forming the gate electrode in the step (b).

7. A method in accordance with claim 1, wherein the step (e) further comprises forming an epitaxial layer on respective low concentration drain and source regions disposed at opposite sides of the gate electrode without any dopant contained in the regions, and then doping the second conductivity type dopant into the regions to form the second conductivity type high concentration drain and source regions.

* * * * *